(12) United States Patent
Park

(10) Patent No.: US 11,226,693 B2
(45) Date of Patent: Jan. 18, 2022

(54) DISPLAY DEVICE WITH TOUCH SENSOR

(71) Applicant: Samsung Display Co., Ltd., Yongin-si (KR)

(72) Inventor: Yong Jae Park, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/391,230

(22) Filed: Apr. 22, 2019

(65) Prior Publication Data
US 2019/0250748 A1    Aug. 15, 2019

Related U.S. Application Data

(63) Continuation of application No. 14/932,316, filed on Nov. 4, 2015, now Pat. No. 10,282,003.

(30) Foreign Application Priority Data

Apr. 9, 2015   (KR) .......................... 10-2015-0050302

(51) Int. Cl.
*G06F 3/041*        (2006.01)
*G06F 3/044*        (2006.01)
(Continued)

(52) U.S. Cl.
CPC ............ *G06F 3/0412* (2013.01); *G06F 3/047* (2013.01); *G06F 3/0446* (2019.05);
(Continued)

(58) Field of Classification Search
CPC ........ G06F 3/0412; G06F 3/047; G06F 3/044; G06F 2203/04107; G06F 3/04164;
(Continued)

(56) References Cited

U.S. PATENT DOCUMENTS 9,019,232 B2    4/2015  Kang et al.
9,099,055 B2    8/2015  Kim et al.
(Continued)

FOREIGN PATENT DOCUMENTS

JP    2008203761      9/2008
KR    1020130051806   5/2013
(Continued)

OTHER PUBLICATIONS

Non-Final Office Action dated Mar. 9, 2017, issued in U.S. Appl. No. 14/932,316.
(Continued)

*Primary Examiner* — Patrick N Edouard
*Assistant Examiner* — Joseph P Fox
(74) *Attorney, Agent, or Firm* — H.C. Park & Associates, PLC

(57) ABSTRACT

A display device includes a display panel and a touch sensor which is disposed on the display panel. The display panel includes a display unit including a pixel, a driving circuit unit disposed outside the display unit, and a first static electricity blocking layer disposed on the driving circuit unit. The touch sensor includes sensing electrodes disposed on the display unit and a second static electricity blocking layer disposed overlapping the first static electricity blocking layer outside of the sensing electrodes.

14 Claims, 17 Drawing Sheets

(51) Int. Cl.
  *H01L 27/32*  (2006.01)
  *H01L 51/52*  (2006.01)
  *G06F 3/047*  (2006.01)

(52) U.S. Cl.
  CPC ........ *G06F 3/04164* (2019.05); *H01L 27/323* (2013.01); *H01L 51/5237* (2013.01); *G06F 2203/04107* (2013.01)

(58) Field of Classification Search
  CPC . G06F 3/0446; G06F 3/0445; H01L 51/5237; H01L 27/323
  See application file for complete search history.

(56) References Cited

U.S. PATENT DOCUMENTS

| | | | |
|---|---|---|---|
| 9,606,390 B2 | 3/2017 | Wang et al. | |
| 2008/0024407 A1* | 1/2008 | Yamaguchi | G02F 1/13452 345/87 |
| 2008/0204619 A1 | 8/2008 | Saitou et al. | |
| 2009/0026932 A1* | 1/2009 | Kwak | H01L 27/3272 313/504 |
| 2010/0201261 A1* | 8/2010 | Kwack | H05B 33/04 313/504 |
| 2010/0220071 A1* | 9/2010 | Nishihara | G06F 3/0443 345/173 |
| 2010/0265206 A1 | 10/2010 | Chen | |
| 2011/0141040 A1* | 6/2011 | Kang | G06F 3/0412 345/173 |
| 2011/0216018 A1* | 9/2011 | Kim | G06F 3/041 345/173 |
| 2011/0279398 A1* | 11/2011 | Philipp | G06F 3/044 345/174 |
| 2011/0316803 A1* | 12/2011 | Kim | G06F 3/044 345/173 |
| 2012/0075218 A1 | 3/2012 | Lin et al. | |
| 2012/0133858 A1* | 5/2012 | Shin | G06F 3/0412 349/59 |
| 2012/0228617 A1* | 9/2012 | Ko | H01L 51/0097 257/59 |
| 2013/0278513 A1* | 10/2013 | Jang | G06F 3/044 345/173 |
| 2014/0049721 A1* | 2/2014 | Huang | G02F 1/136204 349/59 |
| 2014/0098513 A1 | 4/2014 | Yi | |
| 2014/0353691 A1* | 12/2014 | Lee | H01L 27/323 257/88 |
| 2015/0116295 A1 | 4/2015 | Pyon | |
| 2015/0189799 A1* | 7/2015 | Makelainen | G06F 3/044 345/174 |
| 2016/0283000 A1* | 9/2016 | Wang | G06F 3/0412 |

FOREIGN PATENT DOCUMENTS

| | | |
|---|---|---|
| KR | 1020140019146 | 2/2014 |
| KR | 101373044 | 3/2014 |
| KR | 10-2014-0077550 | 6/2014 |
| KR | 101426376 | 8/2014 |

OTHER PUBLICATIONS

Final Office Action dated Sep. 22, 2017, issued in U.S. Appl. No. 14/932,316.
Non-Final Office Action dated May 18, 2018, issued in U.S. Appl. No. 14/932,316.
Notice of Allowance dated Dec. 20, 2018, issued in U.S. Appl. No. 14/932,316.
Office Action dated Apr. 8, 2021 for Korean Patent Application No. 10-2015-0050302.

* cited by examiner

DISPLAY DEVICE WITH TOUCH SENSOR

CROSS-REFERENCE TO RELATED APPLICATION

This application is a continuation of U.S. patent application Ser. No. 14/932,316, filed on Nov. 4, 2015, issued as U.S. Pat. No. 10,282,003 on May 7, 2019, and claims priority from and the benefit of Korean Patent Application No. 10-2015-0050302, filed on Apr. 9, 2015, which are hereby incorporated by reference for all purposes as if fully set forth herein.

BACKGROUND

Field

Exemplary embodiments relate to a display device with a touch sensor.

Discussion of the Background

A display device may include a touch sensor to input information from a touch from a user's finger, a pen, or the like. Among the types of touch sensors, a capacitive type may sense a position of the touch from a change in capacitance between two electrodes spaced apart from each other in response to a touch.

To make a display device flexible, the display device may be made thin. For this purpose, the touch sensor is embedded in the display device. An on-cell type touch sensor does not include an extra substrate and a sensing electrode may be directly disposed on any one component of the display device.

Meanwhile, an edge of the display device may be vulnerable to static electricity. The edge of the display device generally includes various kinds of driving circuits including thin film transistors and wiring. Therefore, when the display device is applied with strong static electricity from the outside, the driving circuits and the wiring may be damaged due to the static electricity, which leads to an operation defect of the display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device which may reduce or suppress damage to driving circuits and wiring due to static electricity from the outside by including a touch sensor in a display device with an on-cell type touch sensor.

Additional aspects will be set forth in the detailed description which follows, and, in part, will be apparent from the disclosure, or may be learned by practice of the inventive concept.

Exemplary embodiments provide a display device including a display panel and a touch sensor disposed on the display panel. The display panel includes a display unit including a pixel, a driving circuit unit disposed outside the display unit, and a first static electricity blocking layer disposed on the driving circuit unit. The touch sensor may include sensing electrodes disposed on the display unit and a second static electricity blocking layer disposed overlapping the first static electricity blocking layer at the outside of the sensing electrodes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE DETAILED DESCRIPTION

Figure 1:
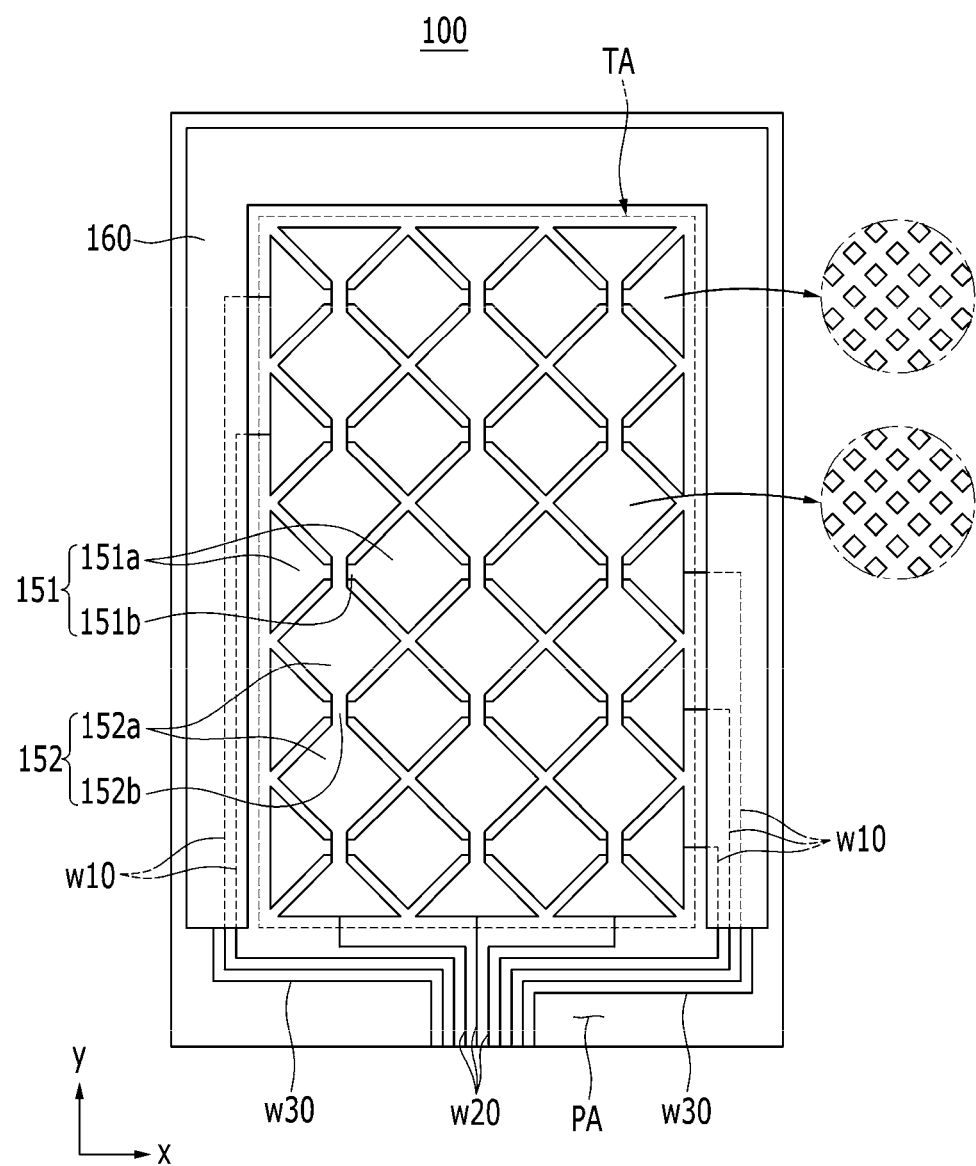
FIG. 1 is a schematic plan view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region disposed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
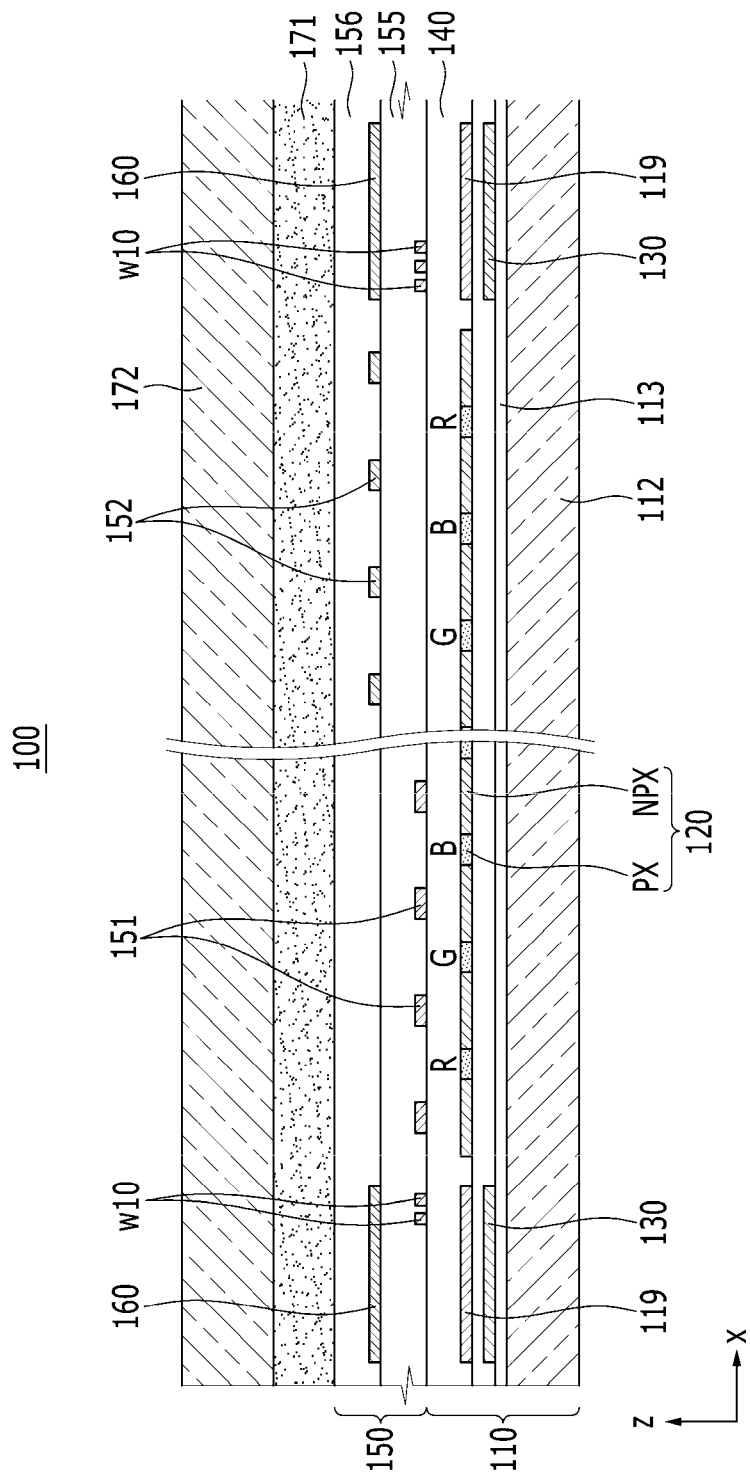
FIG. 2 is a schematic cross-sectional view of the display device illustrated in FIG. 1.

FIG. 1 is a schematic plan view of a display device according to a first exemplary embodiment and FIG. 2 is a schematic cross-sectional view of the display device illustrated in FIG. 1.

Referring to FIG. 1 and FIG. 2, a display device 100 according to an exemplary embodiment includes a display panel 110 displaying an image and a touch sensor 150 disposed on the display panel 110. The display device 100 may further include a transparent adhesive layer 171 and a cover window 172 disposed on the touch sensor 150. The cover window 172 may protect the touch sensor 150 and the display panel 110 from an external impact, a scratch, and the like.

The display panel 110 includes a substrate 112, a display unit 120 and a driving circuit unit 130 disposed on the substrate 112, and an encapsulation 140 encapsulating the display unit 120 and the driving circuit unit 130. The display unit 120 includes pixels PX disposed spaced apart from each other at a distance and displays an image by a combination of light emitted from the pixels PX. A gap between the pixels PX is a non-pixel NPX. The display unit 120 includes the pixels PX and a non-pixel NPX disposed between the pixels PX.

The driving circuit unit 130 is disposed outside the display unit 120. The driving circuit unit 130 may include a scan driving circuit and/or a data driving circuit. The driving circuit unit 130 includes thin film transistors and wiring, and the driving circuit unit 130 is connected to the pixels PX of the display unit 120 to apply an electrical signal to the pixels PX.

The display panel 110 includes a first static electricity blocking layer 119 disposed overlapping the driving circuit unit 130 to suppress damage to the driving circuit unit 130 due to static electricity from the outside. The first static electricity blocking layer 119 may be made of the same material and disposed on the same layer as at least one of electrodes of the display unit 120. The first static electricity blocking layer 119 may be applied with a common voltage or a ground voltage.

The display panel 110 may be an organic light emitting diode display. Each pixel in the organic light emitting diode display includes an organic light emitting diode emitting light and a pixel circuit controlling the organic light emitting diode. The pixel circuit includes at least two thin film transistors and at least one capacitor.

Figure 3:
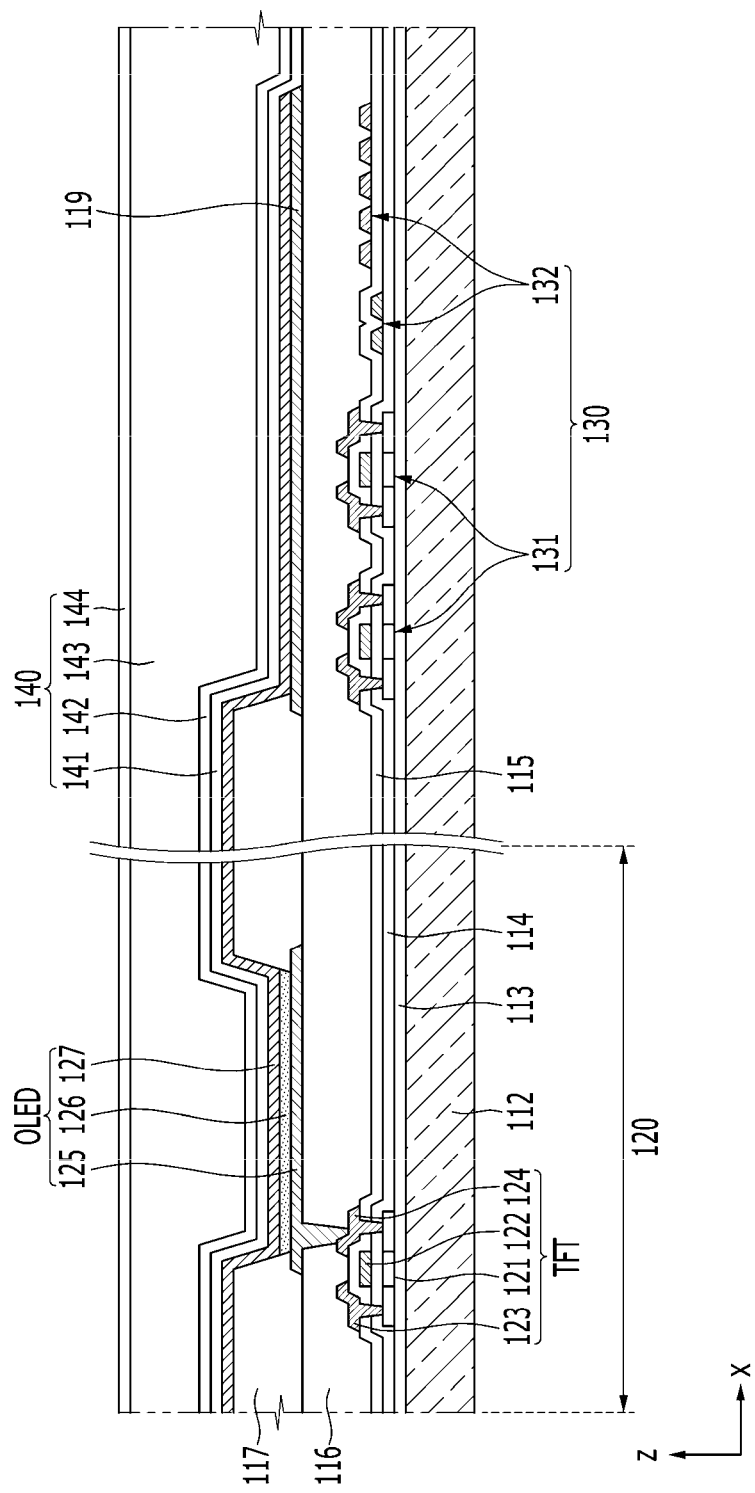
FIG. 3 is a partial cross-sectional view of an organic light emitting diode display.

FIG. 3 is a partial cross-sectional view of an organic light emitting diode display. Referring to FIG. 3, a buffer layer 113 is disposed on the substrate 112, and a semiconductor layer 121 is disposed on the buffer layer 113. The semiconductor layer 121 includes a channel region which is not doped with impurities, and a source region and a drain region disposed at respective sides of the channel region, which are doped with impurities. A gate insulating layer 114 is disposed on the semiconductor layer 121, and a gate electrode 122 is disposed on the gate insulating layer 114. The gate electrode 122 overlaps the channel region of the semiconductor layer 121.

An interlayer insulating layer 115 is disposed on the gate electrode 122, and the source electrode 123 and the drain electrode 124 are disposed on the interlayer insulating layer 115. The source electrode 123 and the drain electrode 124 are respectively connected to the source region and the drain region of the semiconductor layer 121 through the via holes respectively formed in the interlayer insulating layer 115 and the gate insulating layer 114. The thin film transistor TFT of the display unit 120 illustrated in FIG. 3 is a driving thin film transistor and is covered with a planarization layer 116.

A pixel electrode 125 is disposed on the planarization layer 116. The pixel electrode 125 is disposed in each pixel, and is connected to the drain electrode 124 of the driving thin film transistor (TFT) through the via holes formed in the planarization layer 116. A pixel defined layer 117 is disposed on the planarization layer 116 and the pixel electrode 125. The pixel defined layer 117 includes an opening to expose a central portion of the pixel electrode 125 on which an emission layer 126 is disposed.

The emission layer 126 is disposed on the pixel electrode 125 and a common electrode 127 is disposed on the emission layer 126 and the pixel defined layer 117. The common electrode 127 is disposed over the whole surface of the display unit 120, for all pixels. The pixel electrode 125 and the common electrode 127 respectively inject one of holes and electrons into the emission layer 126. Electrons and holes are combined in the emission layer 126 to generate excitons and light is emitted by energy generated when the excitons drops from an excited state to a ground state.

The pixel electrode 125 may be formed of a reflective layer and the common electrode 127 may be formed of a transparent layer or a transflective layer. Light emitted from the emission layer 126 is reflected at the pixel electrode 125 and transmitted through the common electrode 127 to the outside. In this case, when the common electrode 127 is formed of the transflective layer, a portion of the light reflected at the pixel electrode 125 is again reflected at the common electrode 127, and the pixel electrode 125 and the common electrode 127 forms a resonance structure to increase light efficiency.

An organic light emitting diode (OLED) may be vulnerable to moisture and oxygen and therefore the encapsulation 140 encapsulates the organic light emitting diode (OLED) to reduce or block the permeation of the moisture and the oxygen from the outside. The encapsulation 140 may include a multilayer of an inorganic layer and an organic layer. For example, the encapsulation 140 may include a capping layer 141, a first inorganic layer 142, an organic layer 143, and a second inorganic layer 144 sequentially stacked on the common electrode 127.

The capping layer 141 may include LiF and the first inorganic layer 142 and the second inorganic layer 144 may include any one of $Al_2O_3$, $SiN_x$, and $SiO_2$. The organic layer 143 may include any one of epoxy, acrylate, and urethane acrylate. According to the encapsulation 140, has a very thin thickness, and therefore, the display device 100 may be a flexible display device.

The buffer layer 113, the gate insulating layer 114, the interlayer insulating layer 115, and the planarization layer 116 may have the same size as the substrate 112 and the driving circuit unit 130 which includes the thin film transistors 131 and the wiring 132 disposed outside the display unit 120. The driving circuit unit 130 is covered with the planarization layer 116 and a first static electricity blocking layer 119 is disposed on the planarization layer 116. The first static electricity blocking layer 119 may be made of the same material as the pixel electrode 125 and may have a size sufficiently covering the driving circuit unit 130.

The first static electricity blocking layer 119 contacts the common electrode 127 and thus, may be electrically connected to the common electrode 127. For example, the first static electricity blocking layer 119 is not covered with the pixel defined layer 117, and exposed. The common electrode 127 is widely disposed on the first static electricity blocking layer 119, and thus, the common electrode 127 may contact the first static electricity blocking layer 119. In this case, the first static electricity blocking layer 119 is applied with the common voltage like the common electrode 127. The encapsulation 140 is disposed to be wider than the display unit 120 to cover the whole of the common electrode 127.

A configuration of the display unit 120, the driving circuit unit 130, and the first static electricity blocking layer 119 is not limited to the present exemplary embodiment of FIG. 3, and exemplary embodiments may have various configuration.

Referring back to FIG. 1 and FIG. 2, the touch sensor 150 includes sensing electrodes 151 and 152 disposed on the display panel 110 and a second static electricity blocking layer 160 which is disposed outside the sensing electrodes 151 and 152 disposed overlapping the driving circuit unit 130. The sensing electrodes 151 and 152 may be disposed on the non-pixels NPX in a mesh shape. The touch sensor 150 further includes passivation layers 155 and 156 covering the sensing electrodes 151 and 152 and the second static electricity blocking layer 160.

Figure 4:
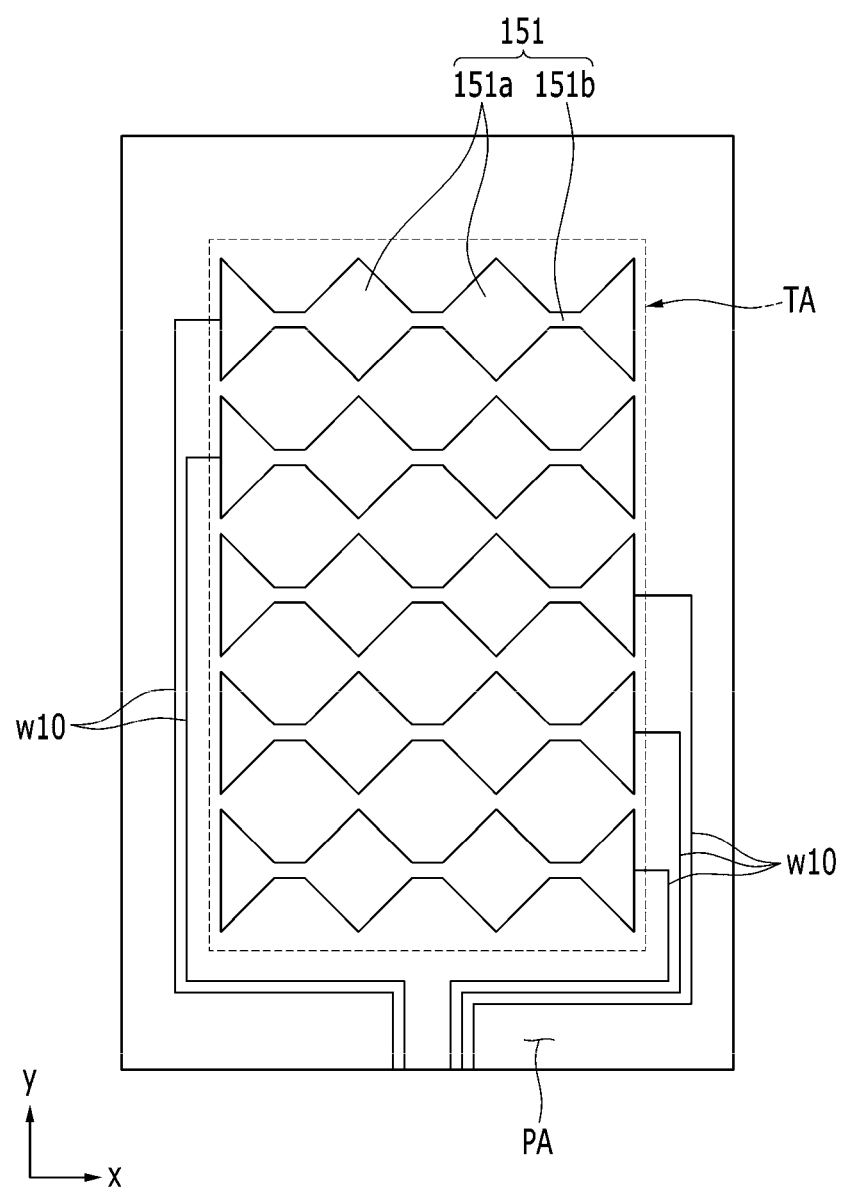
FIG. 4 is a schematic plan view of a first sensing electrode included in the display device illustrated in FIG. 1.
Figure 5:
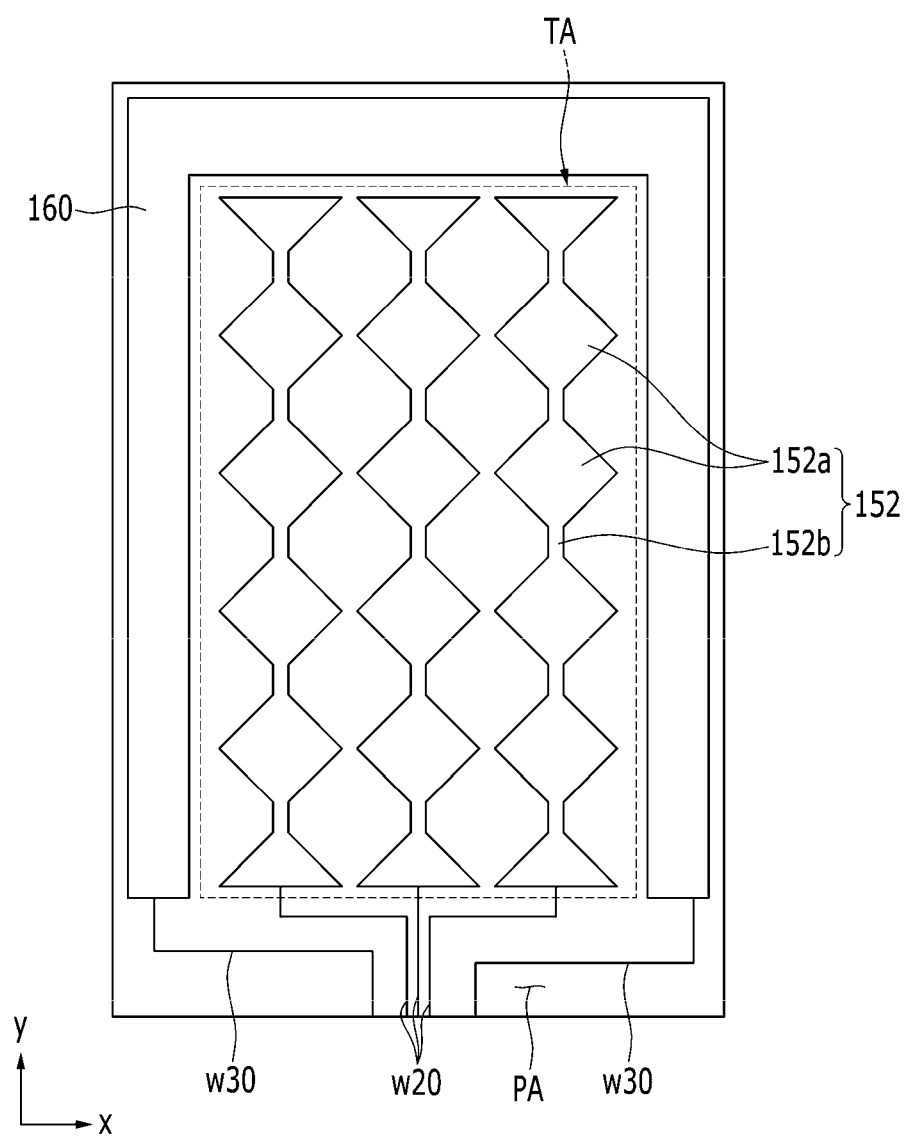
FIG. 5 is a schematic plan view of a second sensing electrode included in the display device illustrated in FIG. 1.

The sensing electrodes 151 and 152 includes the first sensing electrode 151 disposed in parallel with a first direction x and a second sensing electrode 152 disposed in parallel with a second direction y crossing the first direction x. FIG. 4 and FIG. 5 are schematic plan views of the first sensing electrode 151 and the second sensing electrode 152, respectively, included in the display device illustrated in FIG. 1.

Referring to FIGS. 1, 2, 4, and 5, the first sensing electrode 151 may include first sensing cell 151a substantially having a rhombus shape and first connection parts 151b connecting the first sensing cells 151a along the first direction x. The first sensing electrode 151 may be a transmitter touch electrode (Tx touch electrode) to which a first touch signal is transmitted to sense coordinate values in the second direction y.

The second sensing electrode 152 may include second sensing cells 152a substantially having a rhombus shape and second connection parts 152b connecting the second sensing cells 152a along the second direction y. The second sensing electrode 152 may be a receiver touch electrode (Rx touch electrode) to which a second touch signal is transmitted to sense coordinate values in the first direction x.

The first sensing electrode 151 is connected to a first wiring w10 and the second sensing electrode 152 is connected to a second wiring w20. The first and second sensing electrodes 151 and 152 are disposed in a touch area TA and the first and second wirings w10 and w20 are disposed in a peripheral area PA outside the touch area TA. The touch area TA may correspond to the display unit 120 of the display panel 110. The shapes of the first sensing cell 151a and the second sensing cell 152a are not limited to the rhombus shape.

The first sensing electrode 151 and the second sensing electrode 152 may be disposed on different layers. For example, the first sensing electrode 151 may be disposed directly on the encapsulation 140 and may be covered with a first passivation layer 155. The second sensing electrode 152 may be disposed on the first passivation layer 155 and may be covered with a second passivation layer 156. Referring back to FIG. 1, the first sensing cell 151a and the second sensing cell 152a are disposed adjacent to each other in plan view, and the first connection part 151b and the second connection part 152b overlap each other insulated from each other by the first passivation layer 155.

The positions of the first sensing electrode 151 and the second sensing electrode 152 may be changed from each other. That is, the second sensing electrode 152 may be disposed directly on the encapsulation 140 and may be covered with the first passivation layer 155. The first sensing electrode 151 may be disposed on the first passivation layer 155 and may be covered with a second passivation layer 156.

The first passivation layer 155 and the second passivation layer 156 are formed to have areas larger than the touch area TA, and may be made of inorganic materials such as silicon nitride ($SiN_x$), silicon oxide ($SiO_2$), etc.

An insulating layer (not illustrated) may be further disposed directly on the encapsulation 140 and the touch sensor 150 may be disposed on the insulating layer (not illustrated). The insulating layer (not illustrated) may reduce parasitic capacitance between the common electrode 127 and the touch sensor 150.

The first and second sensing electrodes 151 and 152 may include low resistance metals such as silver (Ag), aluminum (Al), copper (Cu), chromium (Cr), and nickel (Ni), or may include conductive nano materials such as silver nanowire and a carbon nanotube. The first and second sensing electrodes 151 and 152 may have a low resistance to reduce an RC delay and may have improved flexibility, and thus may reduce crack from repeated distortion such as warping.

The first and second sensing electrodes 151 and 152 may be disposed on the non-pixels NPX in a mesh shape. Accordingly, the first and second sensing electrodes 151 and 152 do not cover the light emitted from the pixels PX, and an area of the first and second sensing electrode 151 overlapping the common electrode 127 may be reduced so the parasitic capacitance may be reduced. Further, the touch sensor 150 uses the display panel 110 as the substrate. Accordingly, the touch sensor 150 may be formed thin, and the display device 100 may have reduced thickness and may be flexible.

The second static electricity blocking layer 160 is disposed in the peripheral area PA disposed outside the touch area TA and overlapping the driving circuit unit 130 to reduce or suppress the damage to the driving circuit unit 130 due to static electricity from the outside. The second static electricity blocking layer 160 is connected to a third wiring w30 and may be made of the same materials and disposed on the same layer as at least one of the sensing electrodes 151 and 152.

Referring to FIG. 5, in the display device 100 according to the first exemplary embodiment, the second static electricity blocking layer 160 is made of the same material and disposed on the same layer as the second sensing electrode 152. That is, the second static electricity blocking layer 160 is disposed in the peripheral area PA on the first passivation layer 155 and may be disposed surrounding three sides of four sides of the touch area TA except for one side on where a pad area PA is disposed.

The pad area PA refers to an area in which an end of the first wiring w10, the second wiring w20, and the third wiring w30 are positioned disposed. The first and second passivation layers 155 and 156 may be disposed over the whole surface of the substrate 112 other than the pad area PA to expose the pad area PA.

The second static electricity blocking layer 160 may be disposed overlapping the first wiring w10 and may be formed to have the same width as that of the first static electricity blocking layer 119. The second static electricity blocking layer 160 is connected to external devices (not illustrated) such as a chip on film (COF), a flexible printed circuit (FPC), etc., through the third wiring w30, and may be applied with a ground voltage or common voltage from the external devices.

The second static electricity blocking layer 160 may be patterned simultaneously with the second sensing electrode 152. Therefore, an additional process for forming the second static electricity blocking layer 160 is not required, and therefore, manufacturing of the touch sensor 150 may be simplified.

The second static electricity blocking layer 160 is disposed overlapping the driving circuit unit 130 and the first static electricity blocking layer 119. That is, the first static electricity blocking layer 119 and the second static electricity blocking layer 160 are disposed over the driving circuit unit 130. It is possible to reduce or suppress the damage to the driving circuit unit 130 due to static electricity from the outside and improve durability of the display device 100 even when the display device 100 is applied with strong static electricity from the outside, by disposing the two static electricity blocking layers 119 and 160 overlapping the driving circuit unit 130.

Figure 6:
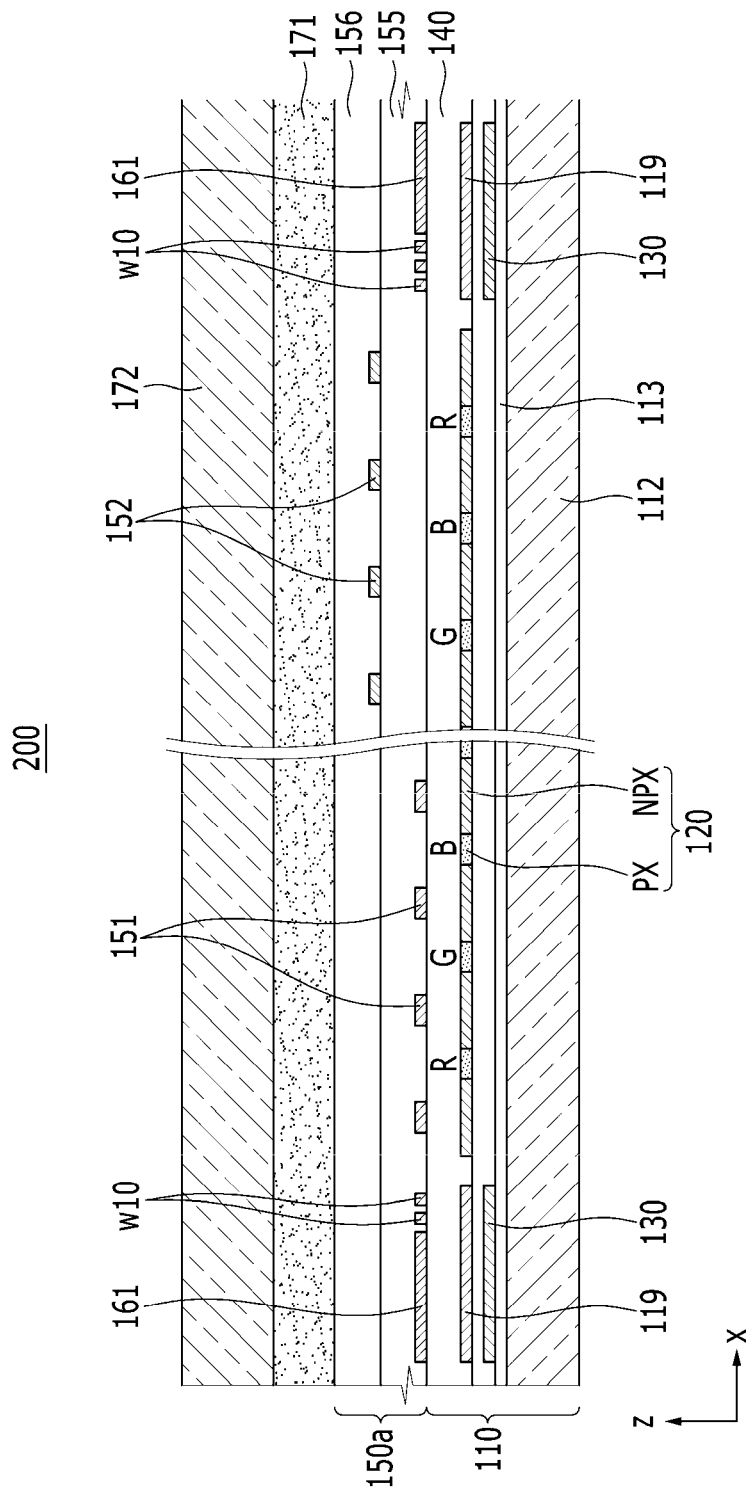
FIG. 6 is a schematic cross-sectional view of the display device according to an exemplary embodiment.
Figure 7:
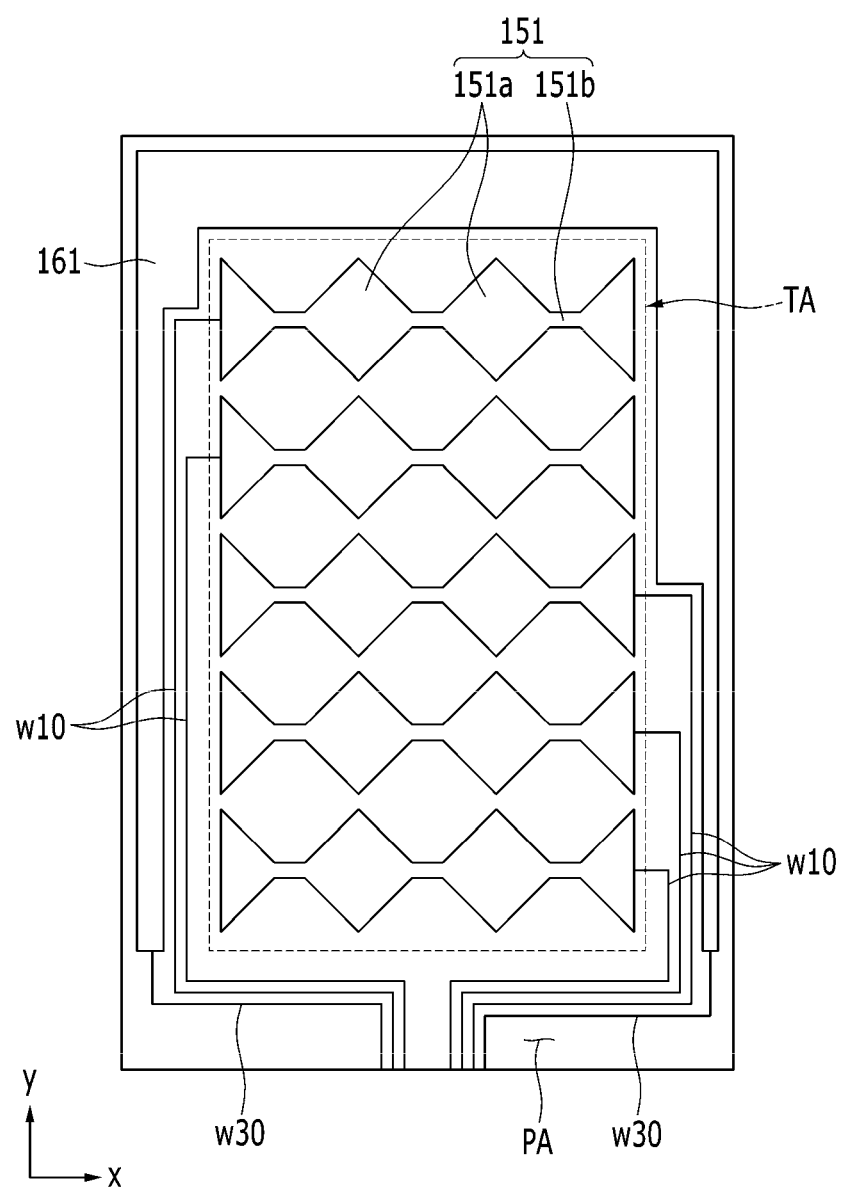
FIG. 7 is a schematic plan view of a first sensing electrode included in the display device illustrated in FIG. 6.
Figure 8:
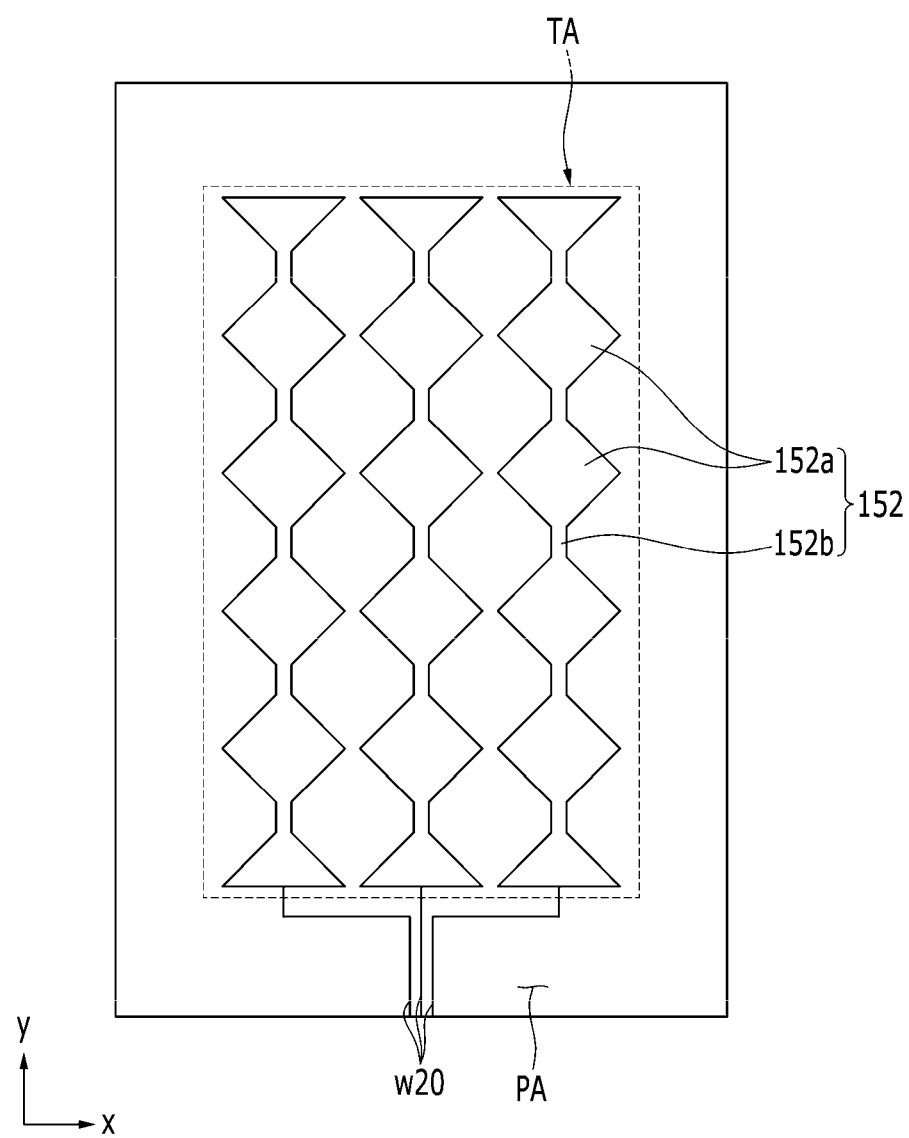
FIG. 8 is a schematic plan view of a second sensing electrode included in the display device illustrated in FIG. 6.

FIG. 6 is a schematic cross-sectional view of a display device 200 according to an exemplary embodiment and FIG. 7 and FIG. 8 are schematic plan views of the first sensing electrode 151 and the second sensing electrode 152, respectively, included in the display device illustrated in FIG. 6.

Referring to FIGS. 6, 7, and 8, in a display device 200 according to an exemplary embodiment, a second static electricity blocking layer 161 of a touch sensor 150a is made of the same material and disposed on the same layer as the first sensing electrode 151. That is, the second static electricity blocking layer 161 may be disposed directly on the encapsulation 140 in the peripheral area PA outside the touch area TA.

The second static electricity blocking layer 161 may be disposed outside the first wiring w10 and may be disposed surrounding three sides of four sides of the touch area TA except for one side on where the pad area PA is disposed. The second static electricity blocking layer 161 may be formed to have a width smaller than that of the first static electricity blocking layer 119, at the left side and the right side of the touch area TA on which the first wiring w10 is disposed. The first wiring w10 and the second static electricity blocking layer 161 overlap the first static electricity blocking layer 119.

The second static electricity blocking layer 161 illustrated in FIGS. 7 and 8 may have a width smaller than that of the first static electricity blocking layer 119, but may have substantially similar effect of reducing or blocking the static electricity applied from the outside compared to the second static electricity blocking layer 160 illustrated in FIGS. 1 and 2. The display device 200 according to an exemplary embodiment may have reduced or suppressed damage to the driving circuit unit 130 from static electricity, and therefore, have improve durability.

In the display device 200 according to the exemplary embodiment, the components other than the second static electricity blocking layer 161 are substantially the same as those of the display device 100 according to the exemplary embodiment.

According to the exemplary embodiments illustrated in FIGS. 1, 2, 3, 4, 5, 6, 7, and 8 describe that the first sensing electrode and the second sensing electrode are disposed on different layers, but exemplary embodiments are not limited thereto, and the first and second sensing electrodes may be disposed on the same layer. In this case, the insulating layer may be selectively disposed where the first sensing electrode and the second sensing electrode cross each other, and the second static electricity blocking layer may be disposed to overlap the first static electricity blocking layer disposed outside of the first and second sensing electrodes.

Further, the exemplary embodiments illustrated in FIGS. 1, 2, 3, 4, 5, 6, 7, and 8 describe that, for example, the touch sensor is a mutual-capacitive type, in which the touch sensor includes the Tx touch electrode and the Rx touch electrode, but exemplary embodiments are not limited thereto, and therefore, the touch sensor may be a self-capacitive type.

Figure 9:
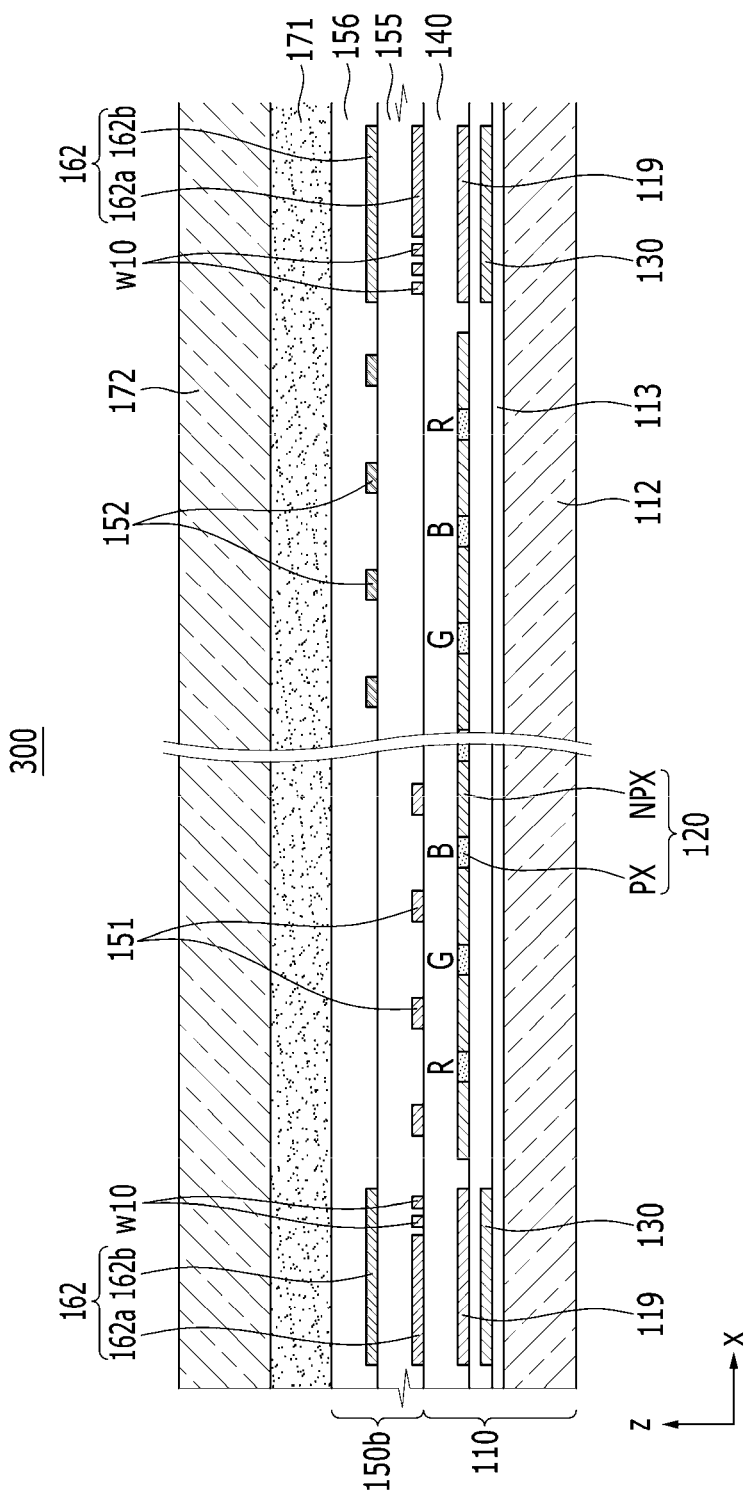
FIG. 9 is a schematic cross-sectional view of a display device according to an exemplary embodiment.
Figure 10:
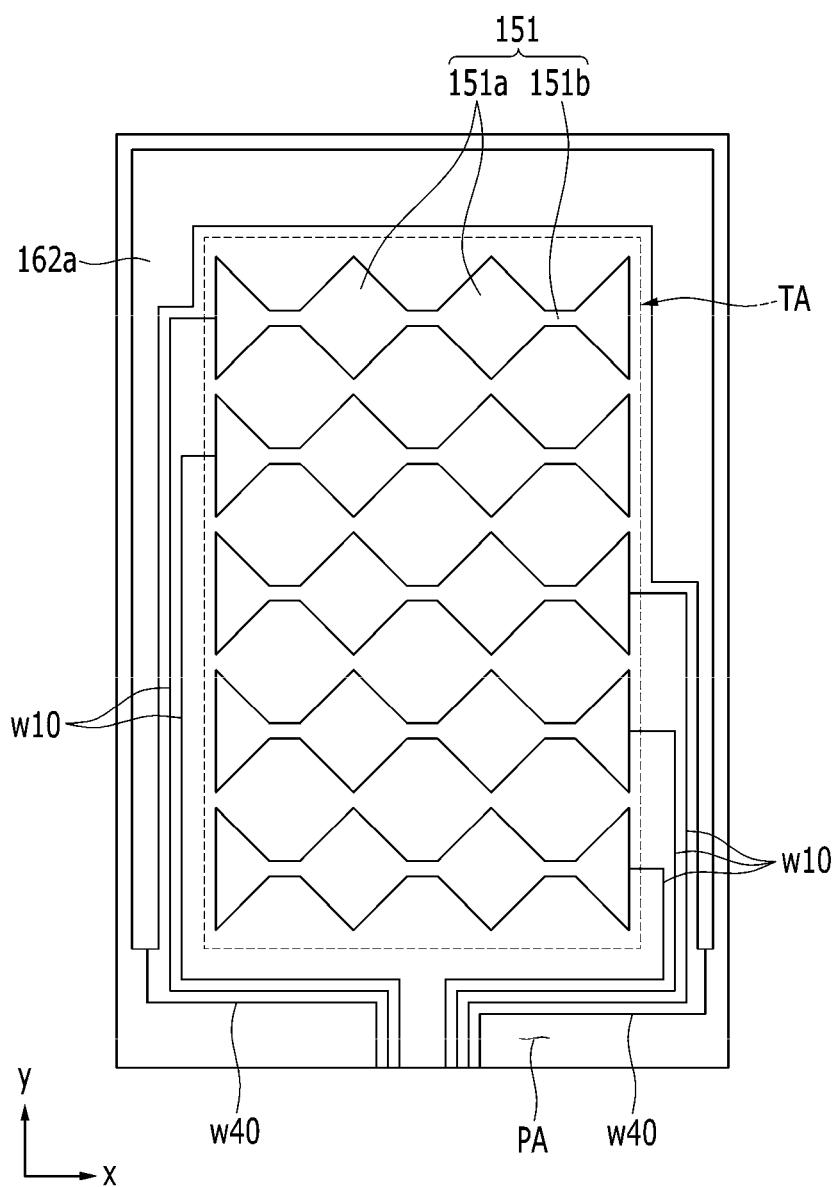
FIG. 10 is a schematic plan view of a first sensing electrode included in the display device illustrated in FIG. 9.
Figure 11:
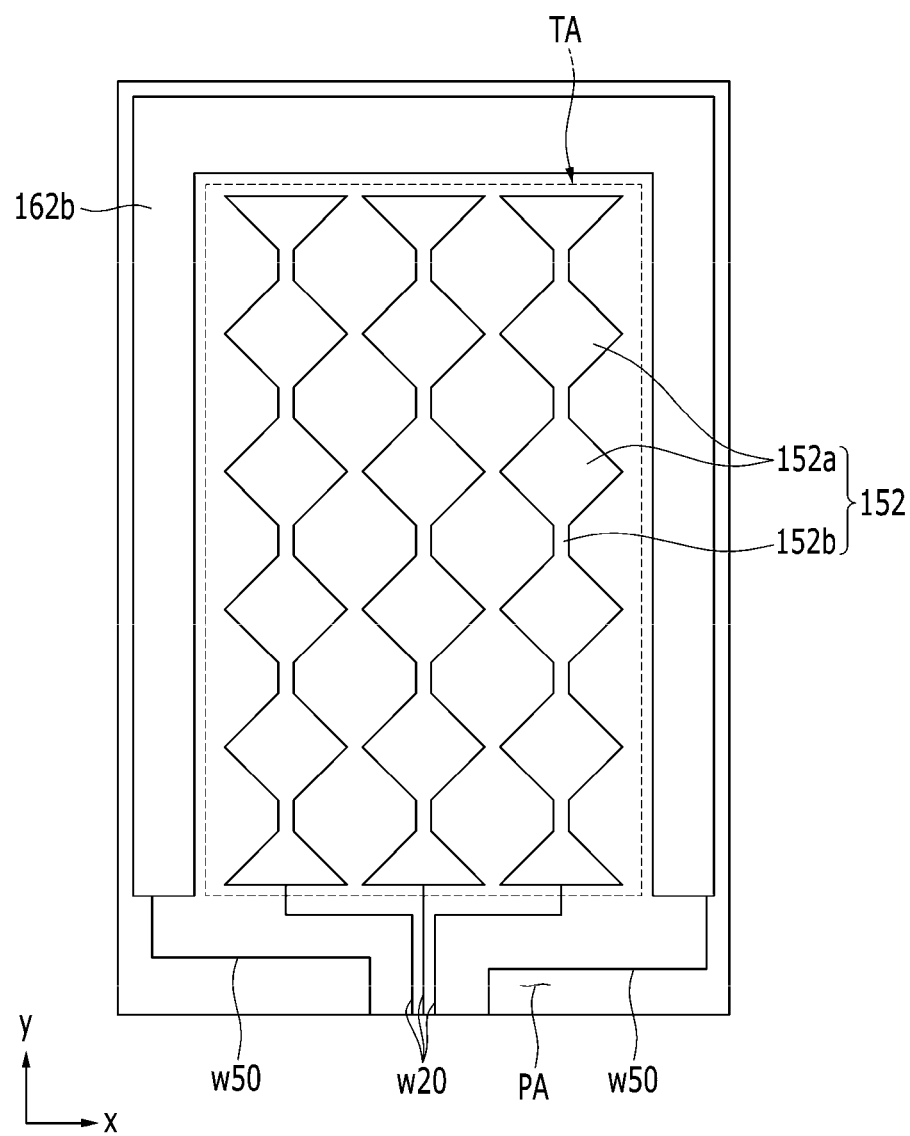
FIG. 11 is a schematic plan view of a second sensing electrode included in the display device illustrated in FIG. 9.

FIG. 9 is a schematic cross-sectional view of a display device 300 according to an exemplary embodiment and FIG. 10 and FIG. 11 are schematic plan views of the first sensing electrode 151 and the second sensing electrode 152, respectively, included in the display device illustrated in FIG. 9.

Referring to FIGS. 9, 10, and 11, in a display device 300 according to the exemplary embodiment, a second static electricity blocking layer 162 of a touch sensor 150b is includes a first layer 162a and a second layer 162b disposed overlapping each other. For example, the second static electricity blocking layer 162 may include a first layer 162a disposed on the same layer as the first sensing electrode 151 and a second layer 162b disposed on the same layer as the second sensing electrode 152. A first passivation layer 155 is disposed between the first layer 162a and the second layer 162b.

The first layer 162a is disposed outside the first wiring w10, directly on the encapsulation 140, and is made of the same material as the first sensing electrode 151. The second layer 162b is made of the same material as the second sensing electrode 152 on the first passivation layer 155. The first layer 162a and the second layer 162b may be disposed surrounding three sides of four sides of the touch area TA except for one side on where the pad area PA is disposed.

The first layer 162a and the first wiring w10 overlap the second layer 162b and the first layer 162a may have a width smaller than that of the second layer 162b at the left side and the right side of the touch area TA on which the first wiring w10 is disposed. The second layer 162b may be disposed to have the same width as that of the first static electricity blocking layer 119.

The first layer 162a is connected to a fourth wiring w40 and the second layer 162b is connected to a fifth wiring w50. The first layer 162a and the second layer 162b are each connected to external devices (not illustrated) through the fourth wiring w40 and the fifth wiring w50 and may thus be applied with a ground voltage or a common voltage therefrom. In the pad region PA, the fourth wiring w40 and the fifth wiring w50 may be disposed in parallel, or the fifth wiring w50 may be disposed on the fourth wiring w40 contacting the fourth wiring w40.

In the display device 300 according to the exemplary embodiment, three static electricity blocking layers 119, 162a, and 162b are disposed over the driving circuit unit 130 and therefore, the display device 300 may provide further protection against the static electricity applied from the outside to reduce or suppress damage to the driving circuit unit 130 due to the static electricity. In the display device 300 according to the exemplary embodiment, the components other than the first layer 162a, the second layer 162b, the fourth wiring w40, and the fifth wiring 50 are substantially the same as those of the display device 100 according to the exemplary embodiment.

Figure 12:
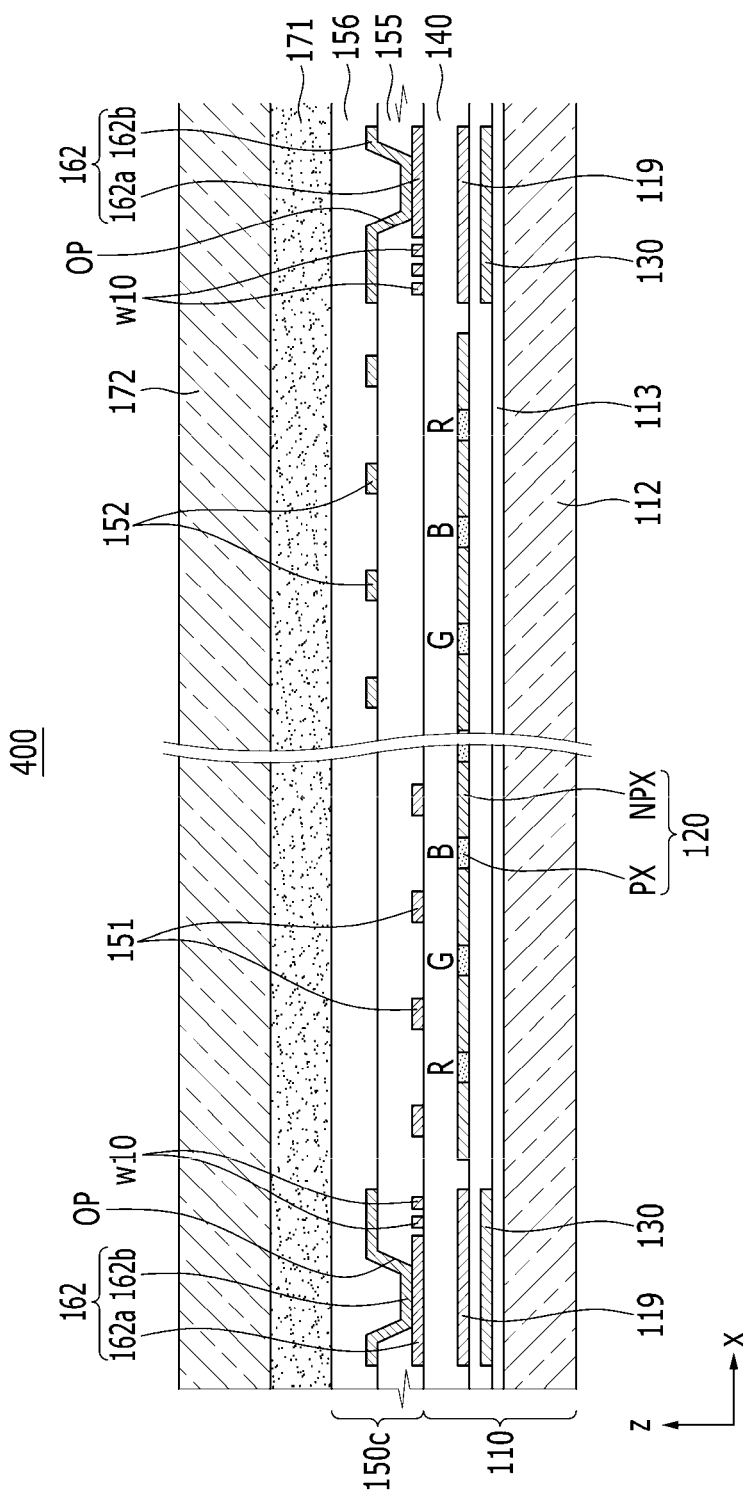
FIG. 12 is a schematic cross-sectional view of a display device according to an exemplary embodiment.
Figure 13:
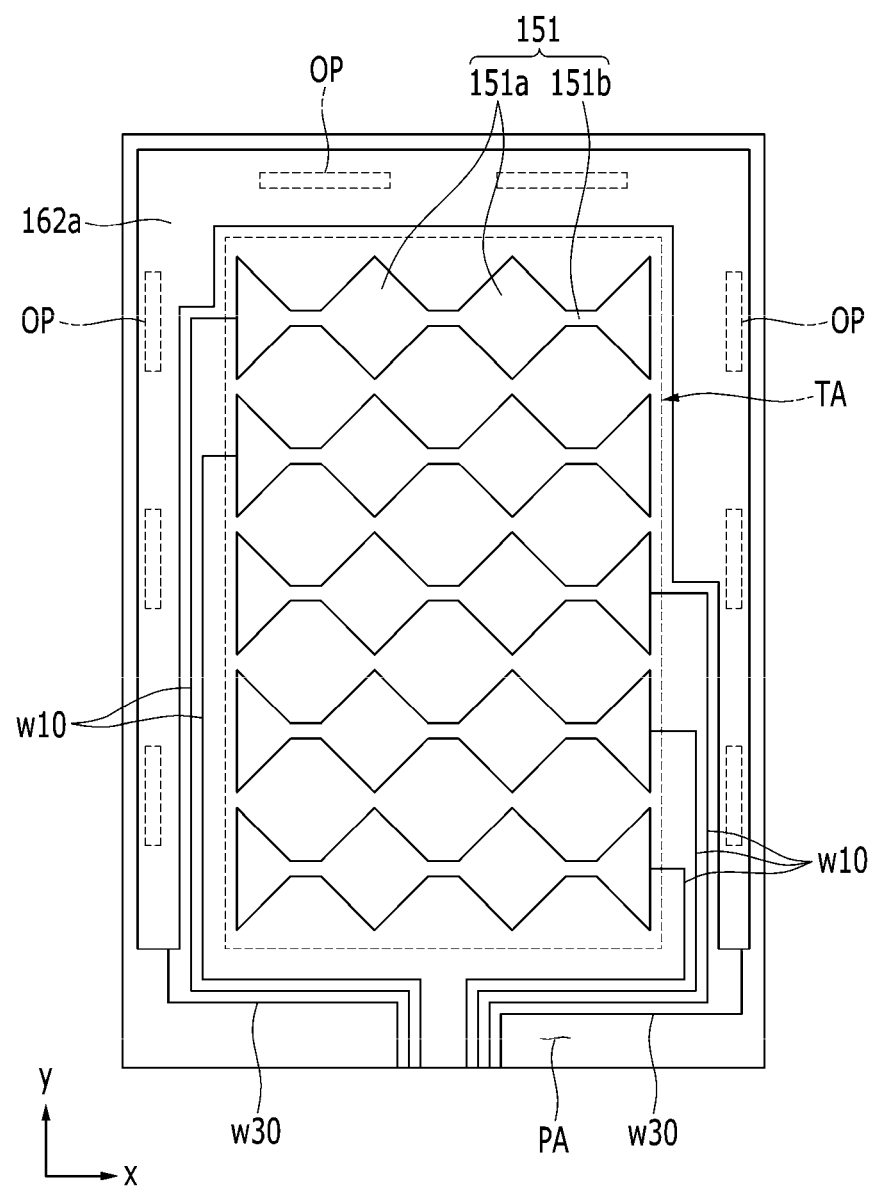
FIG. 13 is a schematic plan view of a first sensing electrode included in the display device illustrated in FIG. 12.
Figure 14:
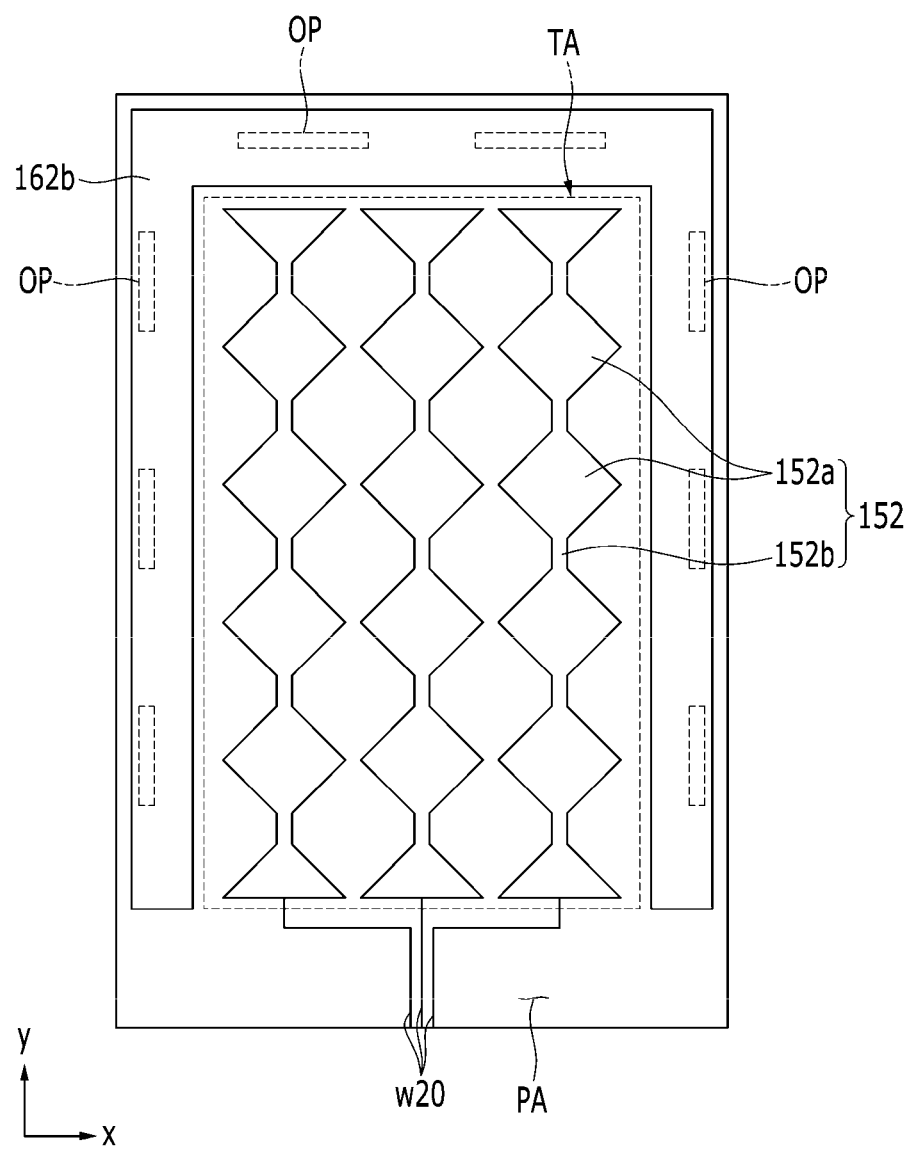
FIG. 14 is a schematic plan view of a second sensing electrode included in the display device illustrated in FIG. 12.

FIG. 12 is a schematic cross-sectional view of a display device 40 according to an exemplary embodiment and FIG. 13 and FIG. 14 are schematic plan views of a first sensing electrode 151 and a second sensing electrode 152, respectively, included in the display device illustrated in FIG. 12.

Referring to FIGS. 12, 13, and 14, in a display device 400 according to the exemplary embodiment, a second layer 162b of a touch sensor 150c is connected to the first layer 162a of the touch sensor 150c through an opening OP formed in the first passivation layer 155. The first passivation layer 155 includes the openings OPs in the peripheral area PA to expose a portion of the first layer 162a. The second layer 162b is disposed over the first layer 162a and the first passivation layer 155 to connect the first layer 162a with the second layer 162b.

As the first layer 162a is connected with the second layer 162b, wiring for applying a ground voltage or a common voltage to the second static electricity blocking layer 162 may be connected to any one of the first layer 162a and the second layer 162b. FIG. 13 and FIG. 14 illustrate, for example, that a third wiring w30 is connected to the first layer 162a, but exemplary embodiments are not limited thereto, and the third wiring w30 may be connected to the second layer 162b and both of the first layer 162a and the second layer 162b may also be connected to each wiring.

In the display device 400 according to the exemplary embodiment, the components other than the structure of the first layer 162a and the second layer 162b including the opening OP in the first passivation layer 155 and the third wiring w30 are substantially the same as those of the display device 100 according to the exemplary embodiment.

Figure 15:
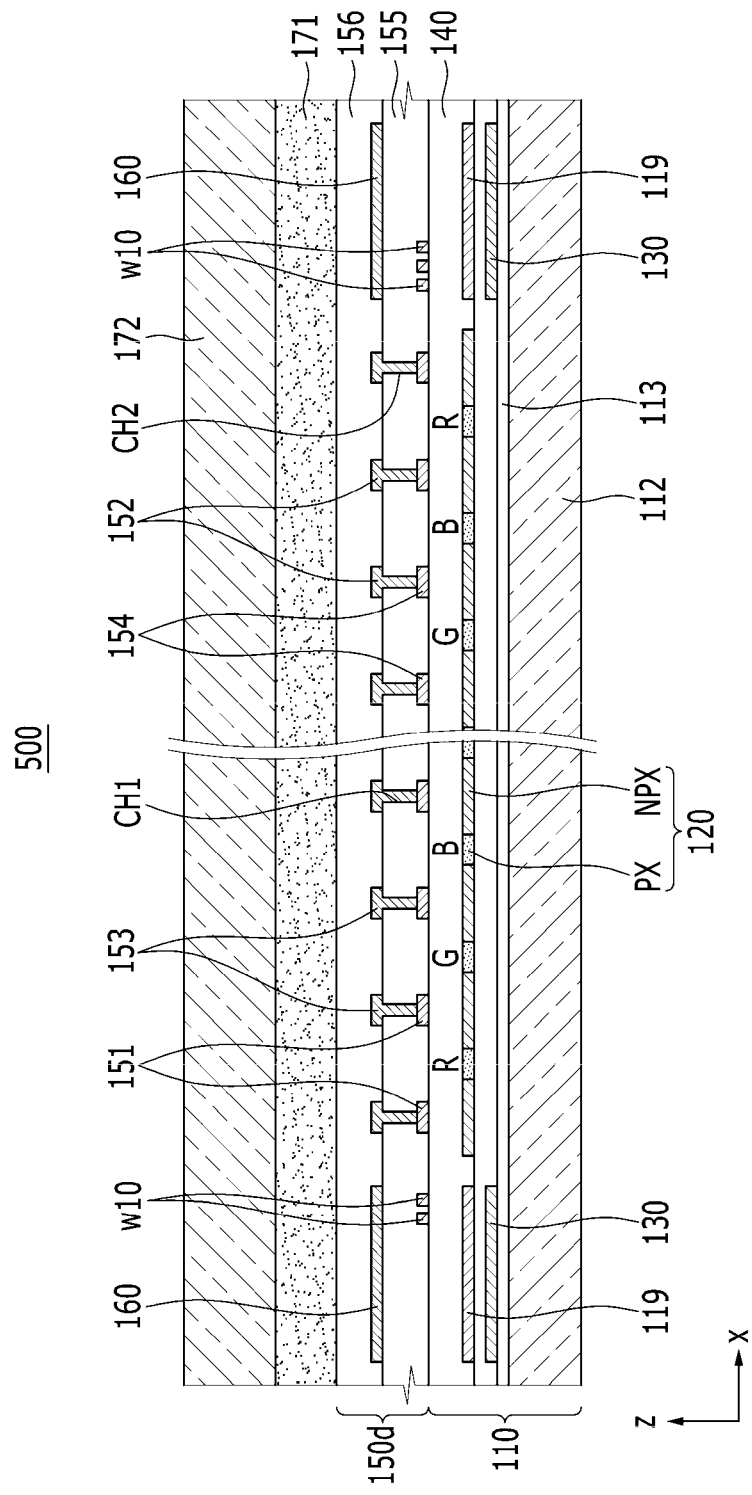
FIG. 15 is a schematic cross-sectional view of a display device according to an exemplary embodiment.
Figure 16:
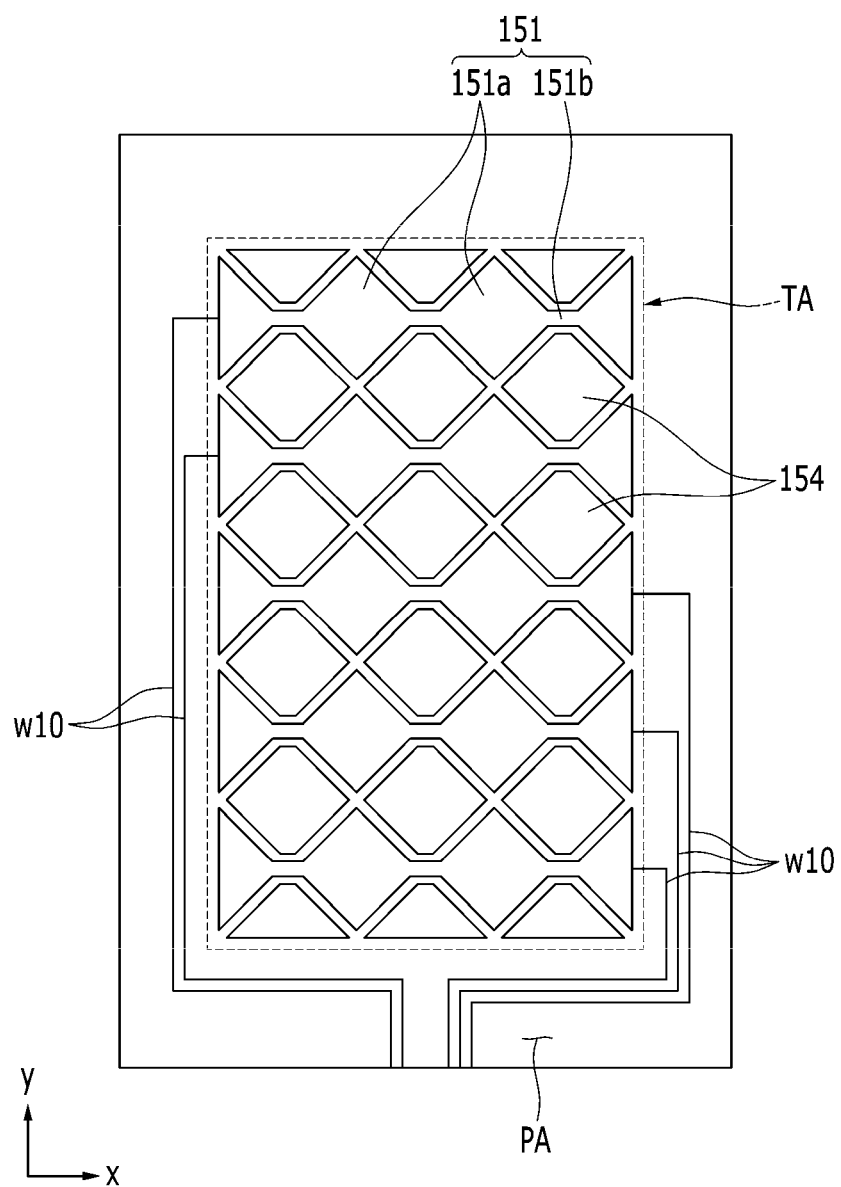
FIG. 16 is a schematic plan view of a first sensing electrode included in the display device illustrated in FIG. 15.
Figure 17:
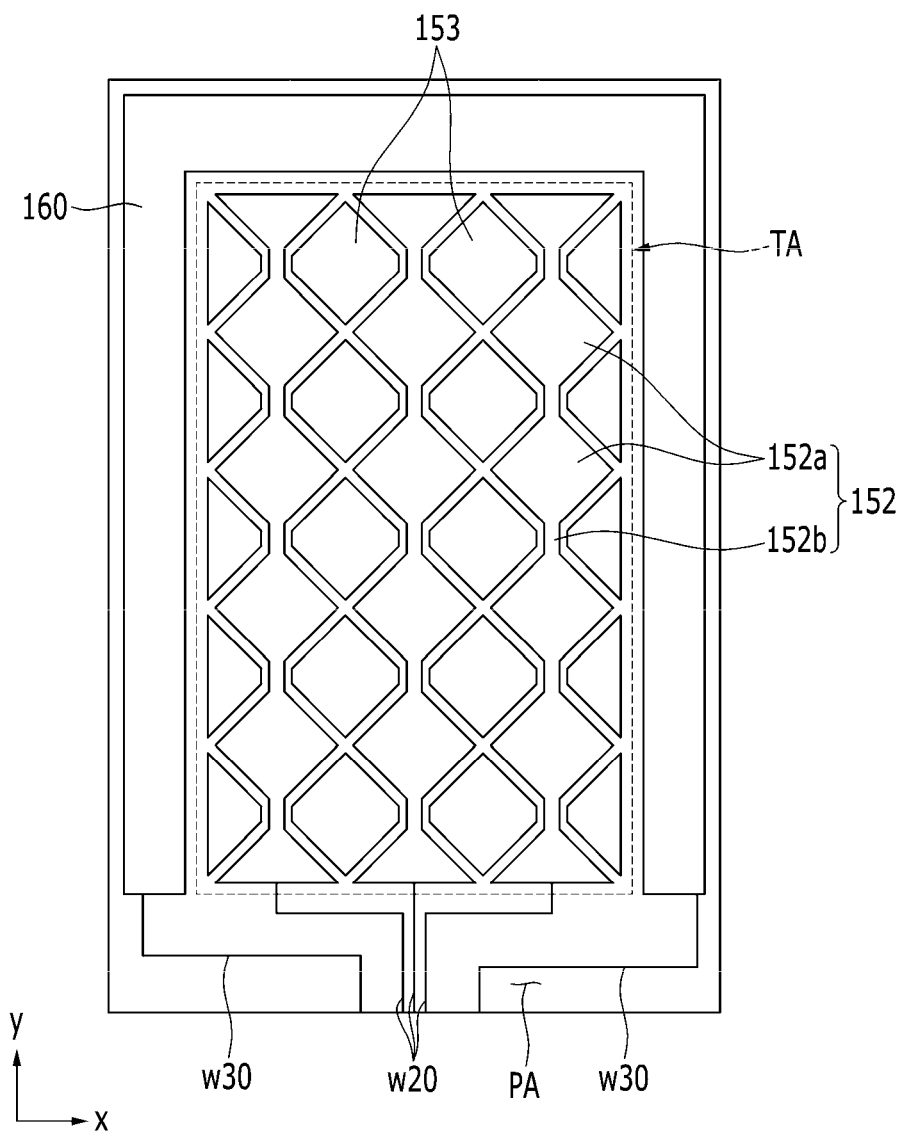
FIG. 17 is a schematic plan view of a second sensing electrode included in the display device illustrated in FIG. 15.

FIG. 15 is a schematic cross-sectional view of a display device 500 according to an exemplary embodiment and FIG. 16 and FIG. 17 are schematic plan views of a first sensing electrode 151 and a second sensing electrode 152, respectively, included in the display device illustrated in FIG. 15.

Referring to FIGS. 15, 16, and 17, in a display device 500 according to the exemplary embodiment, a touch sensor 150d includes a first auxiliary electrode 153 which is disposed overlapping the first sensing cell 151a and connected to the first sensing cell 151a, and a second auxiliary electrode 154 which is disposed overlapping the second sensing cell 152a and connected to the second sensing cell 152a. The first auxiliary electrode 153 and the second auxiliary electrode 154 are disposed in the touch area TA and may be disposed on the non-pixels NPX in a mesh shape.

The first sensing electrode 151 and the second auxiliary electrode 154 may be made of the same material on the same layer and the second sensing electrode 152 and the first auxiliary electrode 153 may be made of the same material on the same layer.

In detail, the first sensing electrode 151 and the second auxiliary electrode 154 are disposed over the encapsulation 140, and the first passivation layer 155 covers the first sensing electrode 151 and the second auxiliary electrode 154. The second auxiliary electrode 154 is independently disposed between the first sensing cells 151a and may substantially have a rhombus shape.

The second sensing electrode 152 and the first auxiliary electrode 153 are disposed over the first passivation layer 155 and the second passivation layer 156 covers the second sensing electrode 152 and the first auxiliary electrode 153. The first auxiliary electrode 153 is independently disposed between the second sensing cells 152a and may substantially have a rhombus shape. However, exemplary embodiments are not limited thereto, and the shapes of the first and second sensing cells 151a and 152a and the first and second auxiliary electrodes 153 and 154 are not limited to the rhombus shape.

The first passivation layer 155 is provided with a first contact hole CH1 through which the first sensing cell 151a is connected to the first auxiliary electrode 153. Further, the first passivation layer 155 is provided with a second contact hole CH2 through which the second auxiliary electrode 154 contacts the second sensing cell 152a.

Each of the first and second sensing electrodes 151 and 152 has reduced linear resistance due to the first and second auxiliary electrodes 153 and 154, and thus the RC delay may be reduced or minimized. Further, a second touch signal flows in the second auxiliary electrode 154 adjacent to the first sensing cell 151a and a first touch signal flows in the first auxiliary electrode 153 adjacent to the second sensing cell 152a to increase or maximize the intensity of the electric field between the first sensing cell 151a and the second sensing cell 152a, thereby increasing the sensing sensitivity of the touch sensor 150d.

In the display device 500 according to the exemplary embodiment, the components other than the first and second auxiliary electrodes 153 and 154 and the first and second contact holes CH1 and CH2 are substantially the same as those of the display devices 100, 200, and 300 according to the exemplary embodiments.

According to exemplary embodiments, the display panel may include the first static electricity blocking layer disposed on the driving circuit unit, and the touch sensor may include the second static electricity blocking layer disposed on the first static electricity blocking layer. Accordingly, the display panel may reduce or suppress the damage to the driving circuit unit due to the static electricity and improve the durability of the display device when the display device is applied with the strong static electricity from the outside, by disposing the first and second static electricity blocking layers on the driving circuit unit.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
    a display panel comprising:
        a display unit comprising:
            a plurality of pixels defined as areas configured to emit light; and
            a non-pixel disposed between the pixels;
        a driving circuit unit disposed outside the display unit; and
        a first static electricity blocking layer disposed on the driving circuit unit; and
    a touch sensor disposed on the display panel, the touch sensor comprising:
        sensing electrodes disposed on the non-pixel in a mesh shape, the sensing electrodes comprising:
            a first sensing electrode comprising first sensing cells disposed in a first direction, the first sensing cells connected to a first wiring disposed on a same layer as the first sensing electrode; and
            a second sensing electrode comprising second sensing cells disposed in a second direction, the second sensing cells connected to a second wiring; and
        a second static electricity blocking layer disposed overlapping the first static electricity blocking layer outside of the sensing electrodes, the second static electricity blocking layer comprising:
            a first layer disposed on the same layer as the first sensing electrode and the first wiring without overlapping the first wiring, the first layer overlapping a portion of the first static electricity blocking layer; and
            a second layer disposed on a same layer as the second sensing electrode, the second layer overlapping the first layer and the first wiring, the first static electricity blocking layer overlapping all of the second layer, and a portion of a lower surface of the second layer directly contacting an upper surface of the first layer,
    wherein:
        the sensing electrodes and the pixels do not overlap each other; and
        a width of the second layer is the same as a width of the first static electricity blocking layer.

2. The display device of claim 1, wherein the pixels comprise a pixel electrode, an emission layer, and a common electrode,
    wherein the first static electricity blocking layer is made of the same material as the pixel electrode and disposed on the same layer with the pixel electrode, and
    wherein the first static electricity blocking layer is electrically connected to the common electrode.

3. The display device of claim 1, wherein the display panel further comprises an encapsulation configured to encapsulate the display unit and the first static electricity blocking layer, and
    wherein the touch sensor is disposed on the encapsulation.

4. The display device of claim 3, wherein the encapsulation is disposed between the first static electricity blocking layer and the second static electricity blocking layer.

5. The display device of claim 1, wherein the touch sensor comprises:
    a touch area configured to recognize a touch; and
    a pad area disposed at one side of the touch area, and
    wherein the second static electricity blocking layer is disposed surrounding three sides of four sides of the touch area except for one side of the touch area on where the pad area is disposed.

6. The display device of claim 1, wherein the touch sensor further comprises:
    a first passivation layer covering the first sensing electrode; and
    a second passivation layer covering the second sensing electrode, and wherein the second sensing electrode is disposed on the first passivation layer.

7. The display device of claim 6, wherein the second static electricity blocking layer is made of the same material as the first sensing electrode and is connected to a third wiring.

8. The display device of claim 6, wherein the second static electricity blocking layer is made of the same material as the second sensing electrode and is connected to a third wiring.

9. The display device of claim 6, wherein the first layer is made of the same material as the first sensing electrode, and wherein the second layer is made of the same material as the second sensing electrode.

10. The display device of claim 9, wherein the first layer is connected to a fourth wiring,
wherein the second layer is connected to a fifth wiring, and
wherein the fourth wiring and the fifth wiring are disposed in parallel with each other or overlapping each other.

11. The display device of claim 9, wherein the first passivation layer is disposed covering the first layer,
wherein the first passivation layer comprises an opening, and
wherein the first layer is electrically connected to the second layer through the opening.

12. The display device of claim 11, wherein the first layer is directly connected to a third wiring, and
wherein the second layer is connected to the third wiring through the first layer.

13. A display device comprising:
a substrate;
a display panel comprising:
a display area and a peripheral area adjacent to the display area;
a display unit disposed on the display area and comprising a thin film transistor, a first electrode electrically connected to the thin film transistor, a second electrode, and an emission layer between the first electrode and the second electrode;
a driving circuit unit disposed on the peripheral area; and
an encapsulation disposed on the display unit and the driving circuit unit, the encapsulation comprising an inorganic layer and an organic layer;
a touch unit disposed on the encapsulation, the touch unit comprising:
a first sensing electrode disposed in parallel with a first direction; and
a second sensing electrode disposed in parallel with a second direction crossing the first direction; and
a blocking layer disposed on the peripheral area and overlapping the driving circuit unit in a plan view, the blocking layer comprising:
a first blocking layer disposed on the substrate; and
a second blocking layer disposed on the first blocking layer; and
wherein:
the first blocking layer comprises a same material as the first electrode;
the second blocking layer comprises a same material as at least one of the first sensing electrode and the second sensing electrode; and
a width of the second blocking layer is the same as a width of the first blocking layer.

14. The display device of claim 13, wherein the first sensing electrode and the second sensing electrode are disposed on a non-pixel between pixels without overlapping the emission layer in mesh shape.

* * * * *